United States Patent
Otagiri et al.

(10) Patent No.: US 6,403,201 B1
(45) Date of Patent: Jun. 11, 2002

(54) SUBSTRATE MATERIAL FOR WIRING AND SUBSTRATE MATERIAL FOR PRINTED CIRCUIT USING THE SAME

(75) Inventors: Tadashi Otagiri; Hisayoshi Nonaka; Yoshitaka Tabuchi, all of Nagoya; Tomio Suzuki, Yokkaichi, all of (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/626,729

(22) Filed: Jul. 27, 2000

(30) Foreign Application Priority Data

Jul. 30, 1999 (JP) .............................. 11-216790
Jun. 27, 2000 (JP) ....................... 2000-193497

(51) Int. Cl.$^7$ ................................................ B32B 3/00

(52) U.S. Cl. ...................... 428/210; 428/209; 428/901; 174/258

(58) Field of Search ................................. 428/209, 901, 428/210; 174/258

(56) References Cited

U.S. PATENT DOCUMENTS

| 4,997,863 A | * | 3/1991 | Ogitani et al. ............... 523/220 |
| 5,108,842 A | * | 4/1992 | Hallgren et al. ............ 428/416 |
| 5,213,886 A | * | 5/1993 | Chao et al. .................. 428/288 |
| 5,670,250 A | * | 9/1997 | Sanville, Jr. et al. ....... 428/323 |
| 5,919,546 A | | 7/1999 | Horiuchi et al. ............ 428/131 |
| 5,948,514 A | * | 9/1999 | Komori et al. ............. 428/209 |

FOREIGN PATENT DOCUMENTS

| JP | 49-8759 | 1/1974 |
| JP | 62-230093 | 10/1987 |
| JP | 10-41435 | 2/1998 |

* cited by examiner

*Primary Examiner*—Cathy Lam
(74) *Attorney, Agent, or Firm*—Burr & Brown

(57) ABSTRACT

There is provided a substrate material for wiring having an excellent thermal resistance, and durability and reliability under severe conditions, characterized in that said substrate material comprises an insulator whose major component is composed of epoxy resin and ceramics having a thermal expansion coefficient of 2 ppm/° C. or less, and that the thermal expansion coefficient is isotropic.

12 Claims, 3 Drawing Sheets

SUBSTRATE MATERIAL FOR WIRING AND SUBSTRATE MATERIAL FOR PRINTED CIRCUIT USING THE SAME

BACKGROUND OF THE INVENTION AND RELATED ART STATEMENT

The present invention relates to a substrate material for wiring, which is an intermediate material constituting a circuit board, and a substrate material for printed circuits using the substrate material for wiring.

Substrate materials for wiring such as printed circuit boards have, at one side, slots for integrated circuits and terminals for connecting various electronic parts and, at the other side, printed conductive paths for connecting the parts, and have numerous applications, such as a key member of electronic appliances.

FIG. 3 is a perspective view showing a printed circuit board. In FIG. 3, a substrate material 1 comprises a sheet-shaped material composed of an insulating material (e.g. epoxy resin or glass) and a conductive metal 2 formed in the sheet-shaped material by plating or the like so as to electrically connect the two surfaces of the sheet-shaped material. On the two surfaces of the substrate material 1 is laminated a thin film layer 3 in which a predetermined circuit is formed; above and below thin film layer 3 are formed terminals and conductive paths 4 by a thin-film method, a printing method or the like; thereby, a printed circuit board is constituted.

The substrate material 1 used in printed circuit boards has heretofore been produced, for example, by producing a sheet-shaped material (glass-epoxy substrate or the like) composed of an insulating material such as epoxy resin or glass, making through holes for electrical connection at the predetermined positions of the sheet-shaped material by drilling, filling the through holes with a conductive metal such as copper by means of plating or the like, and sealing the through holes with a sealant.

In the above production, however, drilling in the shaped material generates chips and has raised concerns about producing defective products, and plating methods yield a higher possibility of generating cracks at the periphery of the substrate material, inviting poor electrical connection.

Further, since a glass-epoxy substrate has a high thermal expansion coefficient of about 50 ppm/° C. in a direction of thickness (vertical direction) though it has a low thermal expansion coefficient of about 15–20 ppm/° C. in a direction of a plane (horizontal direction), which causes a mismatch of thermal expansion coefficient with the copper material provided by plating in a throughhole. Therefore, the throughholes are lacking in reliability.

Further, in the drilling of the throughholes, the marginal ratio of throughhole length (substrate thickness)/hole diameter is about 5 and hence, for example, the lower limit of hole diameter is about 0.2 mm in the case of a substrate material having a thickness of 1 mm. That is, in drilling methods, it has been difficult to highly integrate the printed circuit board by decreasing the diameter of through holes.

In view of these problems, there was proposed in JP-A-49-8759 a circuit board obtained by inserting, into a frame electric wires composed of Ni, Co or the like, pouring thereinto a molten insulating material composed of an epoxy resin or the like, curing the insulating material, and cutting the resulting material at a plane perpendicular to the metal wires to allow the two surfaces of the substrate to have electrical connection to one another.

In this circuit board, however, an insulating material such as epoxy resin causes, in curing, a volume shrinkage of about 2 to 3%, which has impaired the dimensional accuracy of throughhole pitches, etc. This has been a big drawback because strict dimensional accuracy is required in highly integrated printed circuit boards.

Further in this circuit board, since no attention is paid to the difference in thermal expansion between the circuit board and thin film layer laminated on one or both surfaces of the circuit board or metal wires, peeling may occur between the circuit board and the photoprocess layer or the metal wires owing to temperature differences during use.

Further, the circuit board does not show sufficient thermal resistance in heat treatment steps at 100° C. or more upon forming a wiring pattern on the circuit board. Moreover, it does not show sufficient durability and/or reliability under conditions of high temperature and/or high humidity.

The present invention has been made in view of the aforementioned conventional problems, and the present invention has an object of providing a substrate material for wiring, which has high dimensional accuracy and is excellent in thermal resistance in heat treatment steps, durability and reliability under conditions of high temperature and high humidity, and can avoid peeling of a thin film layer from the substrate during use; particularly providing a substrate material for printed circuit, in which peeling of metal wires from the substrate material can be avoided and reliability of through-holes can be improved as well as the aforementioned properties.

SUMMARY OF THE INVENTION

According to the present invention, there is provided a substrate material for wiring, characterized in that said substrate material comprises an insulator composed mainly of epoxy resin and ceramics having a thermal expansion coefficient of 2 ppm/° C. or less, and that the thermal expansion coefficient is isotropic.

The thermal expansion coefficient of the present substrate material is 5–30 ppm/° C., and difference in thermal expansion coefficient between horizontal and vertical directions is 30% or less.

In a substrate material for wiring of the present invention, the epoxy resin preferably contains glycidyl ether type epoxy resin, and the glycidyl ether type epoxy resin is further preferably bisphenol A type epoxy resin and/or novolac type epoxy resin.

According to the present invention, there is further provided a substrate material for wiring, characterized in that said substrate material comprises an insulator formed by pouring a material composed mainly of epoxy resin and ceramics having a thermal expansion coefficient of 2 ppm/° C. or less into a mold, and that the thermal expansion coefficient is isotropic. In the present invention, it is preferable that the viscosity of the material is 10 Pa☐s or less at the time when the material is poured into a mold.

Further, a substrate material for wiring of the present invention has a characteristic that the thermal expansion is 10 –25 ppm/° C.

Moreover, a substrate material for wiring of the present invention is preferably made of a molding material containing 100 parts by weight of glycidyl ether type epoxy resin as major material, 50–150 parts by weight of an acid anhydride as a hardener, and 300–3000 parts by weight of ceramics having a thermal expansion coefficient of 2 ppm/° C. or less.

The ceramics having a thermal expansion coefficient of 2 ppm/° C. is preferably amorphous silica, and the amorphous silica preferably has an average particle size of 50 μm or less. Further, it is preferable to add, to the molding material for a substrate material for wiring of the present invention, 0.5–30 parts by weight of a coupling agent, and further 30–120 parts by weight of a flame retardant.

A coloring agent is preferably added thereto for coloring, and the coloring is preferably black.

In the substrate material for wiring of the present invention, copper plating is preferably applied to a surface or both surfaces of the substrate material for wiring, and a copper foil is preferably applied to a surface or both surfaces of the substrate material for wiring.

Furthermore, according to the present invention, there is provided a substrate material for printed circuit, characterized in that conductive metal wires are embedded at given pitches in the aforementioned substrate materials for wiring.

DETAILED DESCRIPTION OF THE INVENTION

Figure 1:
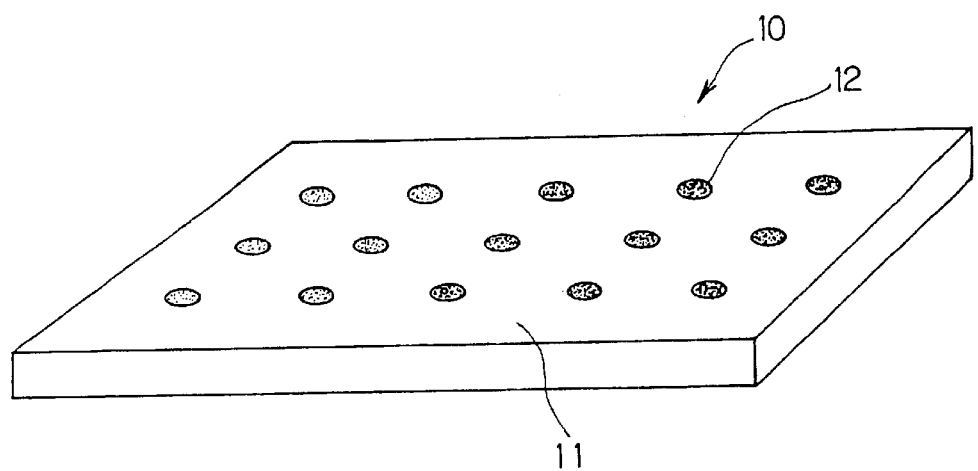
FIG. 1 is a perspective view showing an embodiment of a substrate material for printed circuit of the present invention.

A substrate material for wiring of the present invention is an insulator having as a matrix plastic wherein a predetermined epoxy resin is hardened by acid anhydride and ceramics having a thermal expansion coefficient of 2ppm/° C. or less, and the thermal expansion coefficient thereof is isotropic.

A substrate material for wiring of the present invention has high dimensional accuracy and is excellent in thermal resistance at heat treatment steps and durability and reliability under conditions of high temperature and high humidity, and it is possible to avoid peeling of a thin film layer during use.

A substrate material for wiring of the present invention is hereinbelow described in detail.

A plastic as a matrix of a substrate material for wiring of the present invention is preferably a plastic prepared by hardening a glycidyl ether type epoxy resin which is the major component, with a hardener (i.e., epoxy resin hardened material).

As a glycidyl ether type epoxy resin as the major component, bisphenol A type epoxy resin may be preferably used, and the epoxy equivalent thereof is preferably 150–250 parts by weight. If the epoxy equivalent thereof is below 150 parts by weight, the plastic becomes too hard after being hardened arid too brittle. On the other hand, if the epoxy equivalent thereof is above 250 parts by weight, the plastic cannot acquire required hardness after being hardened, and the glass transition point Tg falls, A glycidyl ether type epoxy resin used for a substrate material for wiring of the present invention is preferably bisphenol A type epoxy resin and/or novolac type epoxy resin. A plastic using as the major component only bisphenol A type epoxy resin and being hardened by a hardener has a glass transition point Tg of about 100–150° C. Here, the number of epoxy groups per molecule of bisphenol A type epoxy resin is two. However, in order to enhance thermal resistance of a substrate for wiring, that is, in order to raise the glass transition point Tg of the substrate up to about 200° C., it is preferable to use a novolac type epoxy resin, which has 3–5 epoxy groups per molecule. The glass transition point Tg of a plastic to be formed can be arbitrarily set by hardening a mixture of bisphenol A type epoxy resin and novolac type epoxy resin in an appropriate ratio.

As an illustrative example of such an epoxy resin having a polyfunctional group(s) usable therein, is an orthocresol novolac type epoxy resin, a phenol novolac type epoxy resin, a bisphenol A novolac type epoxy resin or the like.

In a substrate material for wiring of the present invention, first a large-sized intermediate block having dimensions of about 500×600×300 (mm) is formed by generally pouring molding, and then, the intermediate block is cut to have a planar shape. Therefore, it is preferable that a hardener for hardening the major component has a high flowability upon pouring, a hardening reaction is relatively slow, and the hardener does not contain any solvent.

As a hardener satisfying such conditions, there are, for example, acid anhydride such as phthalic anhydride, tetrahydromethyl phthalic anhydride, hexahydro phthalic anhydride, trimellitic acid anhydride, methylnadic anhydride, and terpene type acid anhydride.

A ceramics dispersed in the matrix is required to have a small thermal expansion coefficient, specifically, of 2ppm° C. or less to suppress thermal expansion of the substrate material for wiring. For example, there can be used a noncrystalline silica having a thermal expansion coefficient of 0.5 ppm/° C., cordierite having a thermal expansion of 1.0 ppm/° C., β-eucryptite having a thermal expansion of −8 ppm/° C., etc.

Since fine wires having a diameter of about 100 μm are sometimes disposed on the substrate for wiring as described below, it is preferable to use ceramics having very fine particles, so as to reduce influences on the fine wires to the utmost.

Specifically, it is preferable to use ceramics having an average particle size of 50 μm or less and the maximum size of 100 μm or less, and it is more preferable to use ceramics having an average particle size of 25 μm or less and the maximum size of 50 μm or less. The lower limit of an average particle size of the ceramic is preferably about 0.5 μm. The particles preferably have a spherical shape for the dispersion of a great amount of the ceramic particles in the matrix. An amorphous silica is best used as the ceramics because amorphous silica having such particle sizes and shapes as those mentioned above can be easily obtained in practical use.

A substrate material for wiring of the present invention can be formed using a raw material for molding containing at least the major component (i.e., epoxy resin), a hardener, and ceramics. Compounding amounts of each of them may be suitably selected according to properties such as insulation property, thermal expansibility and abrasion resistance and objects.

A substrate material for wiring of the present invention is preferably formed using a raw material for molding containing at least 50–150 parts by weight of an acetic anhydride as a hardener and 300–3000 parts by weight of ceramics having a thermal expansion coefficient of 2 ppm/° C.° C. or less to 100 parts by weight of a glycidyl ether type epoxy resin which is the major component in view of lowering the thermal expansion rate and suppressing volume shrinkage upon being hardened and further ensuring flowability upon being poured into a mold.

To the aforementioned raw material for molding may be added additives besides the major component (i.e., epoxy resin), the hardener, and the ceramics. For example, as a hardening accelerator, there may be added tertiary amine type hardeners such as tris (dimethylaminomethyl) phenol, and 2-ethyl-2methylimidazole, diazabicyclo undecene (DBU).

It is also preferable to add 0.5–30 parts by weight of a coupling agent. This is because stability of the substrate material for wiring is enhanced since the bonding of the plastic and the ceramic becomes firm, and the entrance of water into the interface is greatly reduced by adding the coupling agent. Specifically, deterioration in four point bending strength after 300 hours in a pressure cooker test (PCT) of 100% RH at 121° C. can be made to be 20% or less.

As the coupling agent, there can be used known coupling agents such as silane-based coupling agents and titanium-based coupling agents. Among them, silane coupling agents such as epoxy type, amino type, and mercapto type. It is particularly preferable to add epoxy type silane coupling in points of less influence on epoxy resin, which is the major component.

A method for adding the coupling agent may be an integral blending, where a major component (i.e., epoxy resin), a hardener, ceramics, and a coupling agent are mixed together at once for coupling; or a pre-treating, where a coupling agent is reacted with ceramics in advance, and subsequently ceramics is subjected to coupling with a major component and a hardener. Depending on the case, it is possible to employ both methods. However, it is preferable to employ a pre-treating method in view of enhancing water resistance and durability.

In the case that the substrate material for wiring is required to be flame proof, 30–120 parts by weight of a flame retardant may be added to the above raw material for molding.

As a flame retardant, there may be used Br compounds such as, antimony trioxide, phosphorous compounds, nitrides, or the like. It is preferable to employ a Br compound because it has less harmful influences on production and properties when the circuit is formed by copper plating or the like on a surface of the substrate material and it is effective even if a small amount of a Br compound is added.

Preferable Br compounds usable as a flame retardant are hexabromobenzene, pentabromobenzene, tribromobenzene, decabromodiphenyl oxide, ethylenebispentabromobiphenyl and tetrabromobisphenol A. Ethylenebispentabromobiphenyl, deca-bromodipheiayl oxide and hexabromobenzene are particularly preferable.

It is also preferable in the present invention that 0.2–3 parts by weight of a coloring agent is added to the above raw material for molding to color the substrate material for wiring. In the case that conductive and insulating circuits are formed on the substrate material for wiring by a photo-lithographic method, sometimes the shape of the circuit pattern cannot be clearly formed because ultraviolet rays of exposure reflects on the substrate. Therefore, in the afore-mentioned cases, reflectivity of ultraviolet rays can be lowered by coloring the substrate material for wiring.

Further, as a coloring of the substrate material for wiring, black, green, blue, yellow, or the like are preferably employed. At this time, reflectivity of ultraviolet rays on the substrate for wiring is about 0.01–0.04%, which can contribute to improvement in precision in forming the circuit pattern.

As the coloring agent, carbon black for black, phthalocyanine green for green or blue, ORASOL (a trademark) yellow for yellow, etc., may be suitably used.

Besides, to the aforementioned raw material for molding may be added various kinds of additives such as a defoaming agent (e.g., a silicon group defoaming agent) to defoam air bubbles when the material is molded, a flowability modifier (e.g., wetting agent, dispersant) to improve flowability of the material when it is molded, and the like, as necessary.

Incidentally, a substrate material for wiring of the present invention is an insulator composed mainly of an epoxy resin and ceramics having a thermal expansion coefficient of 2 ppm/° C. or less and characterized in that the thermal expansion coefficient is isotropic. Since the substrate material for wiring can be formed by pouring, it is excellent in workability and provides the benefit of being capable of coping with a complex shape.

A substrate material for wiring of the present invention can be produced by pouring a raw material for molding containing the major component (i.e., epoxy resin), a hardener, ceramic, and other additives in a mold having a predetermined capacity, hardening the major component in the raw material for molding to obtain an intermediate block, and cutting the intermediate block to give a planer shape by a band saw, a wire saw, or the like.

Upon pouring molding, it is preferable to employ vacuum pouring to prevent gas from remaining in the mold.

A composite material including resin, ceramic, etc., used when a substrate material for wiring of the present invention is formed preferably has a viscosity, upon pouring, of 10 Pa·s or less, and more preferably 7 Pa·s or less. In the present invention, an intermediate block is obtained in a production step of a substrate material for wiring by pouring molding. Therefore, it is important for the composite material including resin, ceramics, etc., to show a viscosity at which pouring molding is possible. Because of this, if a viscosity of the material upon pouring is above 10 Pa·s, flowability of the material is not sufficient, and the pouring molding becomes difficult. Therefore, sufficient flowability can be ensured upon pouring in a step of producing an intermediate block by controlling a viscosity of the material at the value or lower.

There may be used, for example, an E-type rotary viscometer of a corn-plate type for measuring viscosity. In this measuring method, temperatures in the portions contacting a liquid of the material and the viscometer are controlled to be predetermined in advance, and about 0.5 ml of the liquid (material) to be measured is put in a gap between corn-plates. After the temperature becomes the same between the liquid to be measured and the measuring jig (for about 1 min.), the liquid is rotated at 50 rpm, and a value after one minute is obtained as a measured viscosity.

The aforementioned substrate material for wiring of the proesnt invention is excellent in insulating ability, abrasion resistance, and moldability upon pouring molding since a ceramic having a thermal expansion coefficient of 2 ppm/° C. or less is dispersed in plastic obtained by hardening predetermined epoxy resin by acid anhydride. Further, the substrate material for wiring has a low thermal expansion coefficient of 5–30 ppm/° C. Furthermore, peeling or the like is hardly caused since the thermal expansion coefficient of the substrate material for wiring can be controlled to match that of the thin film layers disposed on both surfaces thereof by changing the kinds and compounding ratios of the plastic and ceramics. It is more preferable that a substrate material for wiring of the present invention has a thermal expansion coefficient of 10–25 ppm/° C.

Further, the difference in thermal expansion coefficient between horizontal and vertical directions is 30% or less, the material exhibits an isotropic thermal expansion coefficient, band the thermal expansion coefficient ranges from about 10–30 ppm/° C., even in a vertical direction. Therefore, there is no mismatch of copper or the like in through-holes with metal in a vertical direction of the substrate. In the case of, for example, a substrate for wiring for mounting a semiconductor chip using this substrate, strain in a vertical direction is not generated upon heating at about 250° C. during soldering. Therefore, no crack is generated in the copper. Thus, a substrate having high reliability can be obtained. Further, in addition to high dimensional accuracy, it is possible to make the glass transition point Tg 120° C. or more, further 150° C. or more. Since the material is thus excellent in heat resistance, it is possible to avoid deformation during a heat treatment at about 100–180° C. when a wiring pattern is formed.

Furthermore, since deterioration of four point bending strength after 300 hours in a pressure cooker test at 121° C. and 100%RH can be suppressed to 20% or less, the material is excellent also in durability and reliability under conditions of high temperature and high humidity.

Though a substrate material for wiring of the present invention may be used alone since it has excellent properties as an intermediate material constituting a circuit substrate as described above, it can be particularly suitably used as a substrate material for printed circuit in which conductive metal wires are disposed at given pitches in the substrate material for wiring.

It becomes possible to avoid peeling of the metal wires from the substrate material due to a difference in thermal expansion between the substrate material and metal wires by using a substrate material for wiring of the present invention, which has a low thermal expansion coefficient close to that of the metal wires. Further, reliability of the through-holes is enhanced.

Figure 2:
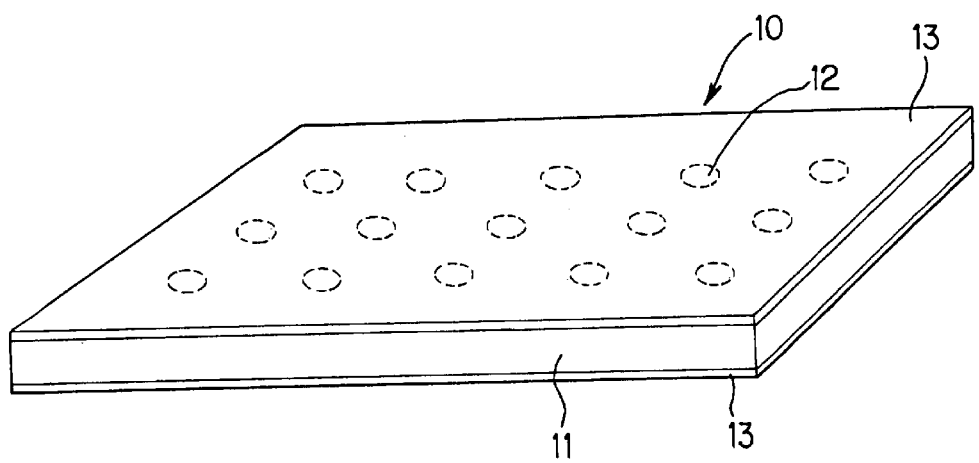
FIG. 2 is a perspective view showing an embodiment of a substrate material for printed circuit according to the present invention with copper plating layers being provided on both sides thereof.

Further, it is preferable that a copper plating is applied to a surface or both surfaces of the substrate material for wiring and the substrate for printed circuit board. It is also preferable that a copper foil is applied to a surface or both surfaces of the substrate material for wiring and the substrate for printed circuit. FIG. 2 is a perspective view showing an embodiment of a substrate material for printed circuit board according to the present invention with copper plating layers being provided on both sides thereof. Both surfaces of the substrate material 10 are electrically connected with each other by providing a copper plating layer 13 on both surfaces of the planer substrate material 11, which includes metal wires 12 disposed at predetermined pitches. Incidentally, a substrate where the metal wires 12 are not embedded may be used.

A method for plating on a surface of a substrate for general printed circuit includes three processes: a surface roughening process, a nonelectrolytic copper plating process, and an electrolytic copper plating process.

The surface roughening process is a process for moderate roughening of a surface of the substrate to enhance adhering strength of the plating. Specifically, there is a swelling process of resin by alkali, an etching process of resin by potassium permanganate, and a neutralizing process of the surface of the substrate by acid. The conditions are set so as to obtain the maximum plating adhesion strength by setting conditions of concentration, temperature, and contact time of agents most suitable for the substrate.

The nonelectrolytic plating process is a process where a copper plating having a thickness of 1 $\mu$m or less by a chemical reaction using copper sulfate or the like as a supply resource of copper and formaldehyde as a reducing agent and a pretreating process of an electrolytic copper plating process. The electrolytic copper plating process is a process where an electrode is provided in copper sulfate, and current density and current distribution is adjusted. The process is conducted until a required thickness of the electrode is obtained after nonelectrolytic copper plating and characterized in quick uniform plating.

Further, a substrate material for wiring of the present invention has a difference in thermal expansion coefficient of 30% or less between horizontal and vertical directions as described above, exhibits an isotropic thermal expansion coefficient, and about 10–30 ppm/° C. even in a vertical direction. Therefore, there is no mismatch with copper (17 ppm/° C.) provided by plating or applying a copper foil, which enables the production of a substrate material for printed circuits having high reliability.

FIG. 1 is a perspective view showing an example of a substrate for printed circuit of the present invention. Both surfaces of the substrate material 10 are electrically connected with each other by end portions of metal wires 12 disposed in a planer substrate material for wiring 11 at predetermined pitches and exposed on both surfaces of the substrate material for wiring 11.

Since such a substrate material can be used as a standard substrate for printed circuits, the material can be adapted to various circuits or uses. For example, a substrate for printed circuits can be formed by disposing a photoprocess layer 3 where a predetermined circuit is formed and a group of connecting terminals 4 on both surfaces of the substrate as shown in FIG. 3.

Though kinds of the metal wires disposed in the substrate material for wiring at predetermined pitches are not particularly limited as long as the wires are conductive, the wires are preferably of one of copper, copper alloys, aluminum, and aluminum alloys.

Since copper has a thermal expansion coefficient of 17 ppm/° C., which is close to a thermal expansion coefficient of 5–30 ppm/° C. of a substrate material for wiring of the present invention, peeling of metal wires from the substrate material due to a difference in thermal expansion between the substrate material and the metal wires can be effectively avoided.

Figure 3:
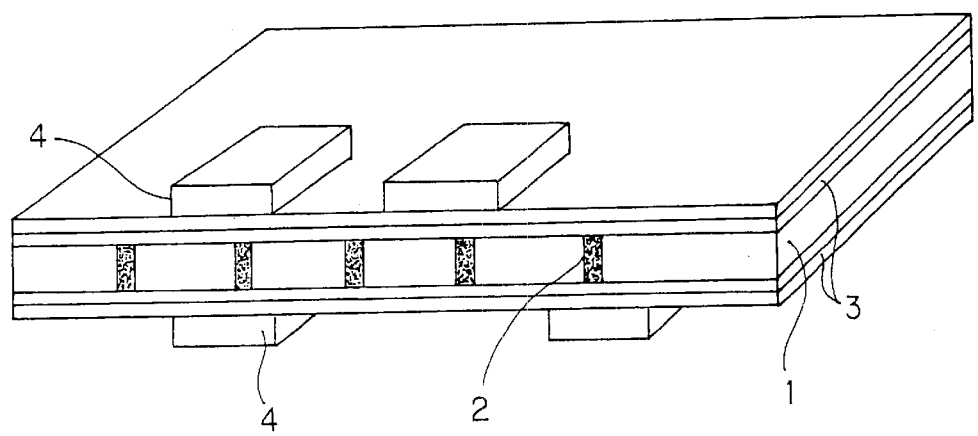
FIG. 3 is a perspective view showing an embodiment of a substrate material for printed circuit.
Figure 4:
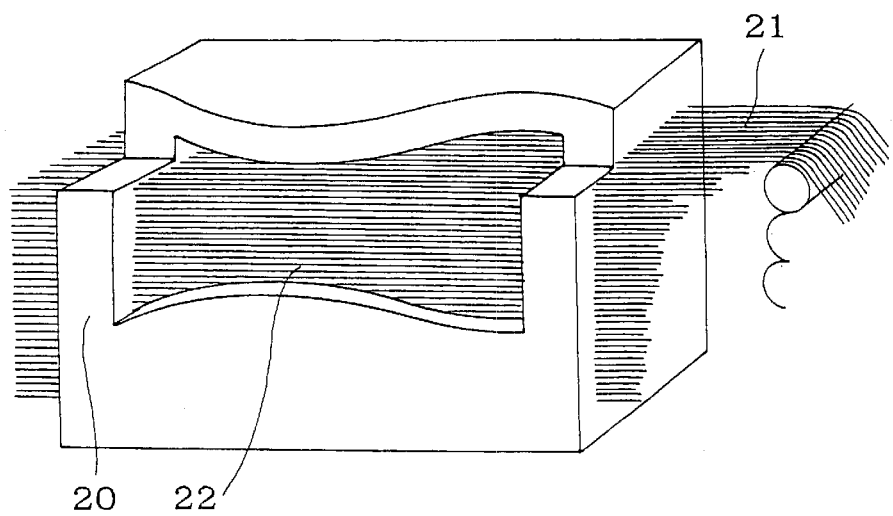
FIG. 4 is a perspective view showing an embodiment of a method for producing a substrate material of the present invention.

Next, a method for producing a substrate material of the present invention is described in accordance with FIG. 3 and FIG. 4. First, as shown in FIG. 4, a molding material 22 containing the major component (i.e., epoxy resin), a hardener, ceramic, and other additives is poured into a mold 20 having numerous metal wires 21 disposed at given pitches and having a predetermined capacity.

Figure 5:
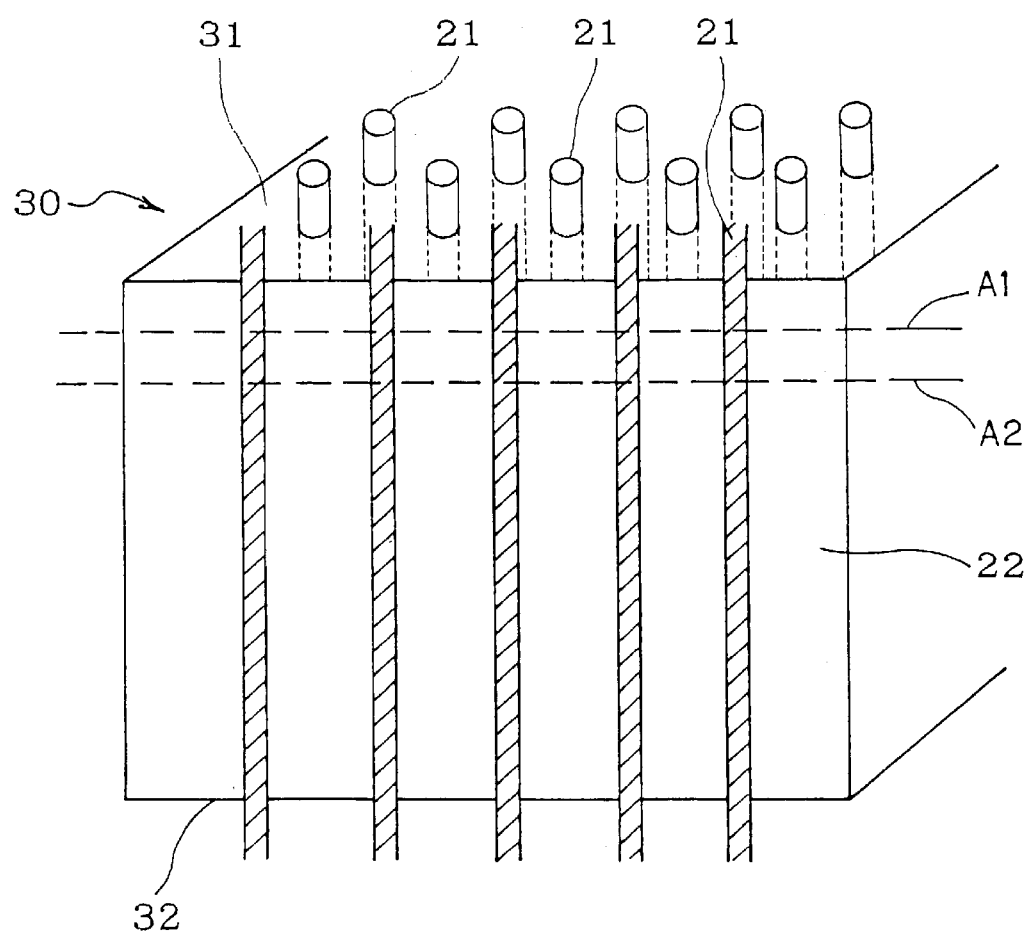
FIG. 5 is a partial perspective view showing an embodiment of an intermediate block of the present invention.

Subsequently, the major component in the raw material for molding is hardened to obtain plastic to produce an intermediate block 30 shown in FIG. 5. The intermediate block 30 includes a substrate material 22 for wiring made of plastic and ceramics and conductive metal wires 21 at given pitches disposed therein. The metal wires 21 are disposed so as to linearly extend from a surface 31 of the intermediate block 30 to the opposite surface 32 and protrude from both surfaces 31 and 32.

A substrate material of the present invention can be produced by cutting such an intermediate block 30 along the plates A1, A2, etc., across the metal wires 21 by a band saw, a wire saw, or the like.

Since the metal wires 21 can be disposed at given pitches with high dimensional accuracy according to the above method, a substrate material having metal wires at small pitches (high integration) of, for example, about 1 mm or less. Further, metal which becomes through-holes is embedded in bulk, and the thermal expansion coefficient of the substrate material in a vertical direction matches therewith, and reliability is further enhanced more than in the case that metal is embedded by plating or the like. These can be obtained by dispersing ceramics having a predetermined thermal expansion coefficient in plastic.

The present invention is hereinbelow described in more detail on the basis of Examples.

EXAMPLE 1

Phosphorous bronze wires having a diameter of 0.1 mm were disposed in a mold having an opening having dimensions of 250×300 mm shown in FIG. 4. 100 parts by weight of bisphenol A type epoxy resin as the major component of epoxy resin, 85 parts by weight of methylhexahydrophthalic anhydride as a hardener, 1 parts by weight of tertiary amine as a hardening accelerator, 550 parts by weight of a spherical amorphous silica having an average particle size of 15 μm, 5 parts by weight of a silane coupling agent of epoxy type, and 50 parts by weight of hexabromobenzene as a frame retardant are put in a mixture having stirring blades and mixed together at 80° C. to obtain a mixture. This mixture was poured into a mold shown in FIG. 4. The composite material had a height of about 200 mm. The material was hardened for 3 hours at 80° C., and then hardened for 12 hours at 130° C. After being cooled, the molded body was taken out of the mold and cut in a direction perpendicular to the wire by a wire saw so as to have a substrate material having a thickness of 1 mm.

In the substrate material, through-holes were in line at 1.0 mm pitch. The substrate material had the characteristics of 125° C. of glass transition point (Tg), 18 ppm/° C. of thermal expansion coefficient in both horizontal and vertical directions, and 145 MPa of bending strength.

This substrate material was subjected to a pressure cooker test of 100% RH at 121° C. and measured for bending strength after 300 hours. The bending strength was 122 MPa, which is 840% of the initial value.

Besides this, a substrate material prepared in the same manner except that the coupling agent was not contained in the composition had Tg of 128° C., thermal expansion coefficient of 18 ppm/° C., and bending strength of 132 MPa. This material was subjected to a pressure cooker test under the same conditions as above. The bending strength was 81 MPa, which is 61% of the initial value.

In addition, this substrate material had frame proof ability corresponding V-O of UL specification in a thickness of 0.6 mm.

EXAMPLE 2

100 parts by weight of bisphenol A type epoxy resin as the main agent of epoxy resin, 80 parts by weight of methylnardic anhydride, 1 parts by weight of DBU as a hardening accelerator, and 600 parts by weight of spherical amorphous silica having an average particle size of 20 μm, 3 parts by weight of mercapto type silane coupling agent, and 60 parts by weight of decabromodiphenyloxide as a frame proof agent are mixed together at 90° C. to obtain a mixture. Then, the mixture was poured into the same mold as in, Example 1. The mixture was hardened for 2 hours at 90° C. and further hardened for 5 hours at 150° C.

After being cooled, the mixture was subjected to processing in the same manner as in Example 1 to obtain a substrate material.

The substrate material had characteristics of 130° C. of glass transition point (Tg), 15 ppm/° C of thermal expansion coefficient in horizontal direction and 14 ppm/° C. of thermal expansion coefficient in vertical direction, and 153 MPa of bending strength. This substrate material was subjected to a pressure cooker test of 100% RH at 121° C. and measured for bending strength after 300 hours. The bending strength was 124 MPa, which is 81% of the initial value.

EXAMPLE 3

100 parts by weight of bisphenol A type epoxy resin as the main agent of epoxy resin, 75 parts by weight of methylnadic anhydride, 0.6 parts by weight of DBU as a hardening accelerator, and 900 parts by weight of silica consisting of spherical amorphous silica having an average particle size of 50 μm and spherical amorphous silica having an average particle size of 10 μm at a ratio of 7 to 3 by weight, and 5 parts by weight of epoxy type silane coupling agent are mixed together at 90° C. to obtain a mixture. Then, the mixture was poured into the same mold as in Example 1. The mixture was hardened for 3 hours at 110° C. and further hardened for 8 hours at 130° C.

The substrate material processed in the same manner as in Example 1 had characteristics of 127° C. of glass transition point (Tg), 10 ppm/° C. of thermal expansion coefficient in both horizontal and vertical directions, and 156 MPa of bending strength. This substrate material was subjected to a pressure cooker test in the same manner as in Example 1. The bending strength was 133 MPa, which is 85% of the initial value.

EXAMPLE 4

Brass wires having a diameter of 0.1 mm were disposed in a mold having an opening having dimensions of 100×100 mm shown in FIG. 4. 50 parts by weight of bisphenol A type epoxy resin as the major component of epoxy resin, 50 parts by weight of phenol novolac type epoxy resin as novolac type epoxy resin, 110 parts by weight of terpene type acid anhydride as a hardener, 1 part by weight of imidazole as a hardening accelerator, 660 parts by weight of a spherical amorphous silica having an average particle size of 15 μm, 1 part by weight of a silane coupling agent of epoxy type, and 80 parts by weight of hexabromobenzene as a frame retardant are put in a mixture having stirring blades and mixed together at 100° C. to obtain a mixture. This mixture was poured into a mold shown in FIG. 4. The composite material had a height of about 300 mm and a viscosity of 3 Pa□s.

The material was hardened for 4 hours at 100° C., and then the material was taken out of the mold to be hardened for 6 hours at 200° C. Then, the molded body was cut in a direction perpendicular to the wire by a wire saw so as to have a substrate material having a thickness of 1 mm.

In the substrate material, through-holes were in line at 1.27 mm pitch. The substrate material had characteristics of 190° C. of glass transition point (Tg), 20 ppm/° C. of thermal expansion coefficient in both horizontal and vertical directions, and 130 MPa of bending strength.

20 (4×5) tile-shaped substrates having dimensions of 100×100×1 mm were disposed at gaps of 4 mm in a mold having dimensions of 500×600 mm. The same material was poured into the gaps to obtain a substrate material having dimensions of 500×600 mm.

The substrate material was subjected to a heat resistance test. After the substrate material was supported by a slit having a width of 3 mm at a longitudinal side thereof, it was set in a jig which can be stood against. After being subjected to a thermal treatment process at 170° C. for 2 hours three times, the material was measured for warpage of the peripheral portion and change in peripheral dimension. As Comparative Examples, a substrate material produced without using polyfunctional epoxy resin (Comparative Example 1) and a FR4 substrate material for a glass-epoxy substrate on the market (Comparative Example 2) were subjected to a heat resistance test. The results are shown in Table 1.

TABLE 1

|  | Example 4 | Comp. Ex. 1 | Comp. Ex. 2 |
|---|---|---|---|
| Warpage in peripheral portion | 3 mm | 20 mm | 3 mm |
| Change in peripheral dimension | 30 μm or less | 200 μm | 350 μm |

As shown in Table 1, a substrate material produced using a novolac type epoxy resin had very little change in peripheral dimension due to a thermal treatment though it had the same level of warpage in peripheral portion as in a substrate material on the market, and therefore can be suitably employed particularly when a build-up substrate is produced.

The substrate material was subjected to a pressure cooker test of 100% RH at 121° C. Neither change in weight nor deformation was found after 1500 hours.

As described above, a substrate material for wiring of the present invention has a high dimensional accuracy, is excellent in thermal resistance in heat treatment processes and durability and reliability under conditions of high temperature and high humidity, and can avoid peeling of a photo-process layer from the substrate material during use because ceramic having a thermal expansion coefficient of 2 ppm/° C. or less is dispersed in plastic prepared by hardening a predetermined epoxy resin by acid anhydride.

Further, a substrate material for printed circuit of the present invention can prevent peeling of metal wires from the substrate material due to the difference in thermal expansion between the substrate material and the metal wires besides the aforementioned excellent properties because a substrate material for wiring of the present invention was used.

What is claimed is:

1. A substrate material for wiring comprising an insulator formed by pouring into a mold a molding material containing 100 parts by weight of a glycidyl ether type epoxy resin, 50–150 parts by weight of an acid anhydride as a hardener, and 300–3000 parts by weight of ceramics, said ceramics having a thermal expansion coefficient of 2 ppm/° C. or less, said ceramics being dispersed in said epoxy resin; the thermal expansion coefficient of said substrate material being isotropic, a difference in thermal expansion coefficient between a horizontal direction and a vertical direction being 30% or less.

2. A substrate material for wiring according to claim 1, wherein the molding material has a viscosity of 10 Pa·s or less when the material is poured into a mold.

3. A substrate material for wiring according to claim 1, wherein said insulator has a thermal expansion of 10–25 ppm/° C.

4. A substrate material for wiring according to claim 1, wherein the amorphous silica has an average particle size of 50 μm or less.

5. A substrate for a printed circuit, comprising:
   conductive metal wires; and
   a substrate material which contains 100 parts by weight of a glycidyl ether type epoxy resin, 50–150 parts by weight of an acid anhydride as a hardener, and 300–3000 parts by weight of ceramics, said ceramics having a thermal expansion coefficient of 2 ppm/° C. or less, said ceramics being dispersed in said epoxy resin; the thermal expansion coefficient of said substrate being isotropic, a difference in thermal expansion coefficient between a horizontal direction and a vertical direction of said substrate being 30% or less, said conductive metal wires being embedded at given pitches in said substrate material.

6. A substrate according to claim 5, wherein said thermal expansion coefficient is 5–30 ppm/° C.

7. A substrate according to claim 5, wherein said glycidyl ether type epoxy resin comprises a bisphenol A type epoxy resin and a novolac type epoxy resin.

8. A substrate according to claim 5, wherein the ceramic having a thermal expansion coefficient of 2 ppm/° C. is an amorphous silica.

9. A substrate according to claim 5, wherein the molding material further contains 0.5–30 parts by weight of a coupling agent.

10. A substrate according to claim 5, wherein the molding material further contains 30–120 parts by weight of a flame retardant.

11. A substrate according to claim 5, wherein copper plating is applied to a surface or both surfaces of the substrate material.

12. A substrate according to claim 5, wherein a copper foil is applied to a surface or both surfaces of the substrate material.

* * * * *